(12) United States Patent
Shirakata et al.

(10) Patent No.: US 8,299,666 B2
(45) Date of Patent: Oct. 30, 2012

(54) CONTROL APPARATUS-INTEGRATED DYNAMOELECTRIC MACHINE

(75) Inventors: Yuji Shirakata, Chiyoda-ku (JP); Dai Nakajima, Chiyoda-ku (JP); Masahiko Fujita, Chiyoda-ku (JP); Masaki Kato, Chiyoda-ku (JP); Kazuyasu Sakamoto, Chiyoda-ku (JP); Takuya Oga, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 269 days.

(21) Appl. No.: 12/819,678

(22) Filed: Jun. 21, 2010

(65) Prior Publication Data

US 2011/0175496 A1 Jul. 21, 2011

(30) Foreign Application Priority Data

Jan. 18, 2010 (JP) .................. 2010-008325

(51) Int. Cl.
*H02K 11/00* (2006.01)
*H02K 9/00* (2006.01)
*H02K 7/00* (2006.01)

(52) U.S. Cl. .................. 310/68 R; 310/64; 310/68 D

(58) Field of Classification Search .................. 310/64, 310/67 D, 68 R
See application file for complete search history.

(56) References Cited

U.S. PATENT DOCUMENTS

| | | | |
|---|---|---|---|
| 6,700,194 B2 * | 3/2004 | Nakajima et al. | 257/707 |
| 7,859,147 B2 * | 12/2010 | Dubuc et al. | 310/68 D |
| 2005/0001492 A1 * | 1/2005 | Bradfield et al. | 310/68 D |
| 2008/0211331 A1 | 9/2008 | Dubuc et al. | |
| 2009/0284106 A1 * | 11/2009 | Utsumi et al. | 310/68 R |

FOREIGN PATENT DOCUMENTS

| | | | |
|---|---|---|---|
| JP | 2001244393 | | 9/2001 |
| JP | 2001244393 A | * | 9/2001 |
| JP | 2003-7966 A | | 1/2003 |
| JP | 2004274992 | | 9/2004 |
| JP | 2004274992 A | * | 9/2004 |
| JP | 2005130568 | | 5/2005 |
| JP | 2005130568 A | * | 5/2005 |
| JP | 2008-543266 A | | 11/2008 |
| JP | 2009232656 | | 10/2009 |
| JP | 2009232656 A | * | 10/2009 |
| WO | 2007/003824 A3 | | 1/2007 |

OTHER PUBLICATIONS

Japanese Office Action issued in Application No. 2010-008325 dated Nov. 22, 2011.

* cited by examiner

*Primary Examiner* — Tran Nguyen
(74) *Attorney, Agent, or Firm* — Sughrue Mion, PLLC

(57) ABSTRACT

A dynamoelectric machine main body, power circuit modules and a field circuit module, and a control apparatus that has a heatsink that is prepared by die casting, and that is mounted integrally onto the dynamoelectric machine main body are included, the heatsink including a plurality of convex heat receiving portions that are disposed so as to project from a front surface of a base plate, and that have heat receiving surfaces, the power circuit modules and the field circuit module including seal main body portions that are constituted by an electrically insulating resin that seal switching elements so as to expose bottom surfaces of element heat radiating portions on reference surfaces that have a surface shape that corresponds to a shape of the heat receiving surfaces, and electrical insulation supporting layers being interposed between the bottom surfaces of the heat receiving surfaces and the element heat radiating portions.

7 Claims, 5 Drawing Sheets

CONTROL APPARATUS-INTEGRATED DYNAMOELECTRIC MACHINE

BACKGROUND OF THE INVENTION

1. Field of the Invention

The present invention relates to a control apparatus-integrated dynamoelectric machine in which a control apparatus is mounted integrally to a dynamoelectric machine main body that has: a stator that has an armature winding; a rotor that has a field winding; and a housing that supports the stator and the rotor, the control apparatus controlling power supply to the armature winding and the field winding.

2. Description of the Related Art

Conventional dynamoelectric equipment includes: a rotor; a stator in which a polyphase winding is disposed; a shaft that supports the rotor so as to be centered on an axis of rotation; a supporting body to which the stator and the shaft are fixed; a heatsink that is integrated inside the supporting body; and control and field modules that control power supply to a field winding in the rotor, and power modules that control power supply to a stator winding in the stator that are respectively mounted to the heatsink (see Patent Literature 1, for example).

The control and field modules and the power modules (hereinafter "control modules") each have switching elements, etc., of which metal oxide semiconductor (MOS) transistors or insulated gate bipolar transistors (IGBTs) are representative.

Although not described in Patent Literature 1 in detail, conventional examples of control modules that can be mounted to a heatsink and used are configurations in which switching elements that are mounted to a front surface of a heat spreader are sealed in a resin by transfer molding, in a similar manner to the semiconductor device according to Patent Literature 2. Here, the rear surface of the heat spreader, which constitutes a radiating surface, is exposed at a bottom surface of a resin package, and bottom surfaces of the control modules are constituted by the radiating surface of the heat spreader and the bottom surface of the resin package.

The heatsink has a flat base plate, and the control modules are mounted to one surface of the base plate (a heat receiving surface) such that radiating surfaces are coupled thermally, heat from the control modules thereby being transferred to the heatsink and radiated from the heatsink.

Patent Literature 1: Japanese Patent Publication No. 2008-543266 (Gazette)

Patent Literature 2: Japanese Patent Laid-Open No. 2003-7966 (Gazette)

In dynamoelectric equipment of this kind, the control modules are often mounted to the base plate so as to ensure electrical insulation between radiating surfaces thereof and the heat receiving surface of the base plate. In that case, the control modules are conventionally mounted to the heatsink with a thermally conductive grease or an electrically insulating sheet that has comparatively good thermal conductivity, such as that described in Patent Literature 2, interposed between the radiating surfaces of the control modules and the heat receiving surface of the base plate such that heat from the control modules is conducted to the base plate while ensuring electrical insulation between the control modules and the base plate.

Now, since the thermally conductive grease or the electrically insulating sheet have significantly inferior thermal conductivity compared with the heatsink, it is necessary to make the thickness of the thermally conductive grease or the electrically insulating sheet as thin as possible such that electrical insulation between the control modules and the base plate is ensured, and the heat from the control modules is also conducted smoothly to the base plate. Conventionally, the thermally conductive grease or the electrically insulating sheet is interposed between the control modules and the base plate by making the bottom surfaces of the control modules as flat as possible, and making the heat receiving surface of the base plate flat by applying milling, but milling of the heatsink is very expensive.

Now, when dynamoelectric equipment of this kind is mass-produced, the heatsinks are conventionally prepared by die casting for purposes of cost reduction. In heatsinks that are prepared using die casting, it is known that baseplate thickness differs during formation such that mainly central portions are concave. Moreover, centers of the base plates are not necessarily the deepest portions.

The front surface shape of the heat receiving surface differs depending on location. In other words, because the portions of the heat receiving surface to which the control modules are mounted are not uniform, it is necessary to prepare shapes of bottom surfaces of each of the control modules so as to have shapes of the mounting portions of the corresponding heat receiving surfaces. In other words, the shapes of the bottom surfaces of a plurality of control modules must be made into different shapes. Consequently, a plurality of control modules that are transfer molded using molds that have identical shapes cannot be used, increasing costs for the control modules. If the heat receiving surface of the base plates is made to conform to the shape of the radiating surfaces of the control modules by applying milling to the heat receiving surface, even though increasing thickness of the thermally conductive grease or the electrically insulating sheet can be avoided, problems such as great expense being required for milling of the base plates, etc., resurface.

SUMMARY OF THE INVENTION

The present invention aims to solve the above problems and an object of the present invention is to provide a control apparatus-integrated dynamoelectric machine that adapts a shape of a heatsink that is prepared by die casting so as to enable power circuit modules and a field circuit module that are prepared using a common molding step to be mounted without leaving large gaps relative to a heat receiving surface of the heatsink without applying milling to the heatsink.

In order to achieve the above object, according to one aspect of the present invention, there is provided a control apparatus-integrated dynamoelectric machine including a dynamoelectric machine main body including: a stator that has an armature winding; a rotor that has a field winding; and a housing that supports the stator and the rotor; and a control apparatus that is mounted integrally onto the dynamoelectric machine main body, the control apparatus including: a power circuit module and a field circuit module that respectively supply electric power to the armature winding and the field winding, the power circuit module and the field circuit module each including: a flat element heat radiating portion that is made of a metal; and a switching element that is mounted to a front surface of the element heat radiating portion; a heatsink that is prepared by die casting, and to which the power circuit module and the field circuit module are mounted; and a switching element controlling means that controls the switching elements. The heatsink includes: a base plate; and a plurality of convex heat receiving portions that are each disposed so as to project from a front surface of the base plate, projecting end surfaces of which constitute heat receiving surfaces, and in which the power circuit module and the field circuit module are respectively mounted to each of the heat receiving surfaces. The power circuit module and the field circuit module each include a seal main body portion that is made of an electrically insulating resin that seals the switching element so as to expose a bottom surface of the element heat radiating portion at a reference surface that has a surface shape that corresponds to a shape of the heat receiving surface. The power circuit module and the field circuit module each is disposed such that the bottom surface of the element heat radiating portion is oriented toward the heat receiving surface. And an electrical insulation supporting layer is interposed between the heat receiving surface and the bottom surface of the element heat radiating portion.

According to a control apparatus-integrated dynamoelectric machine according to the present invention, because the heatsink is prepared so as to have a shape that has respective convex heat receiving portions for mounting each of the power circuit modules and the field circuit module, the heat receiving surfaces of the respective convex heat receiving portions have a small area. Thus, the heat receiving surfaces of the respective convex heat receiving portions can be formed so as to have approximately uniform shapes even if the heatsink is prepared by die casting, enabling use of power circuit modules and a field circuit module that are mounted so as to face the respective heat receiving surfaces of the respective convex heat receiving portions that each have bottom portions that have identical shapes. In other words, power circuit modules and a field circuit module that are prepared using a common molding step can be mounted without leaving large gaps relative to heat receiving surfaces of respective convex heat receiving portions.

DETAILED DESCRIPTION OF THE PREFERRED EMBODIMENTS

Preferred embodiments of the present invention will now be explained with reference to the drawings.

Embodiment 1

Figure 1:
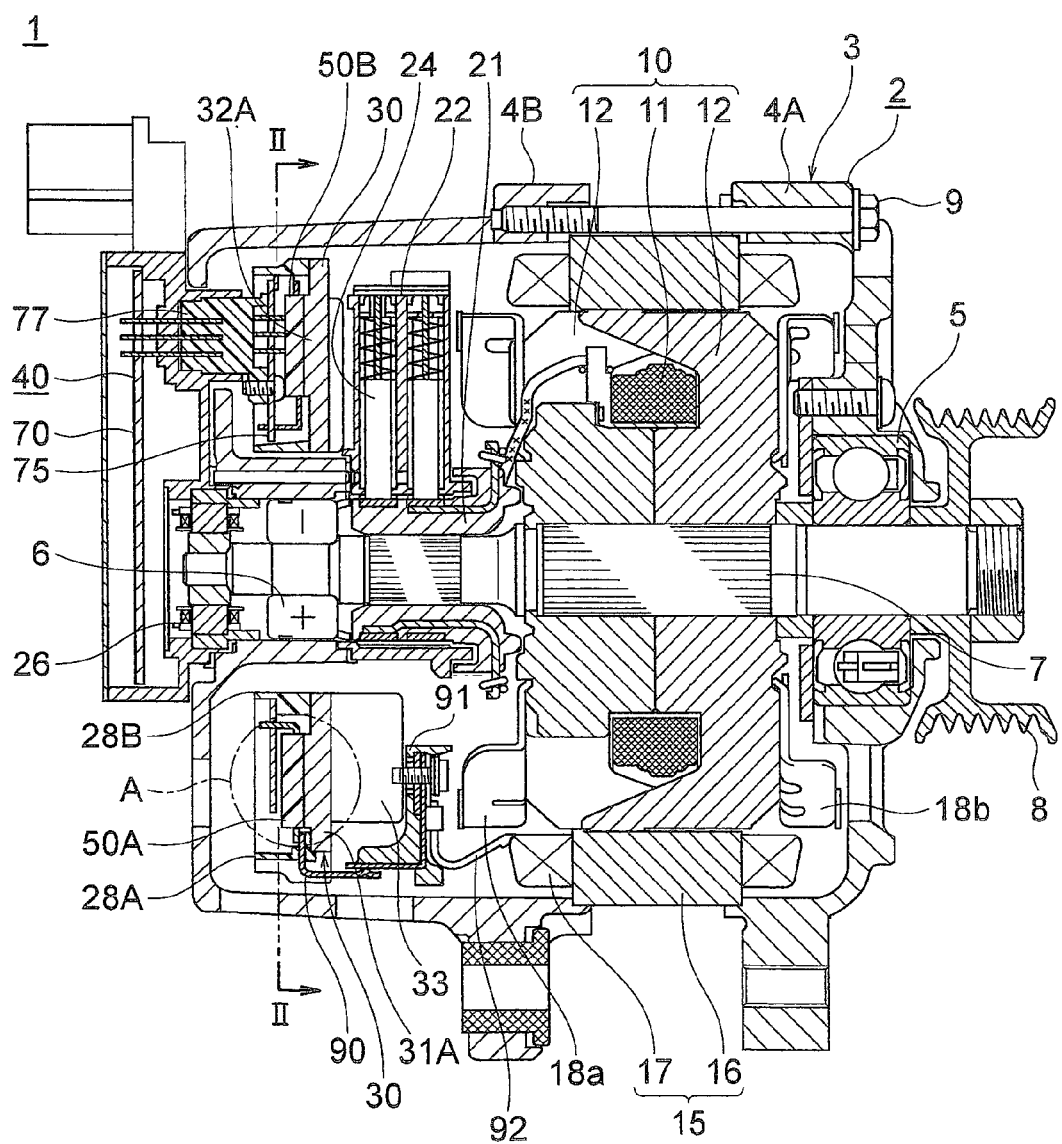
FIG. 1 is a cross section of a control apparatus-integrated dynamoelectric machine according to Embodiment 1 of the present invention.
Figure 2:
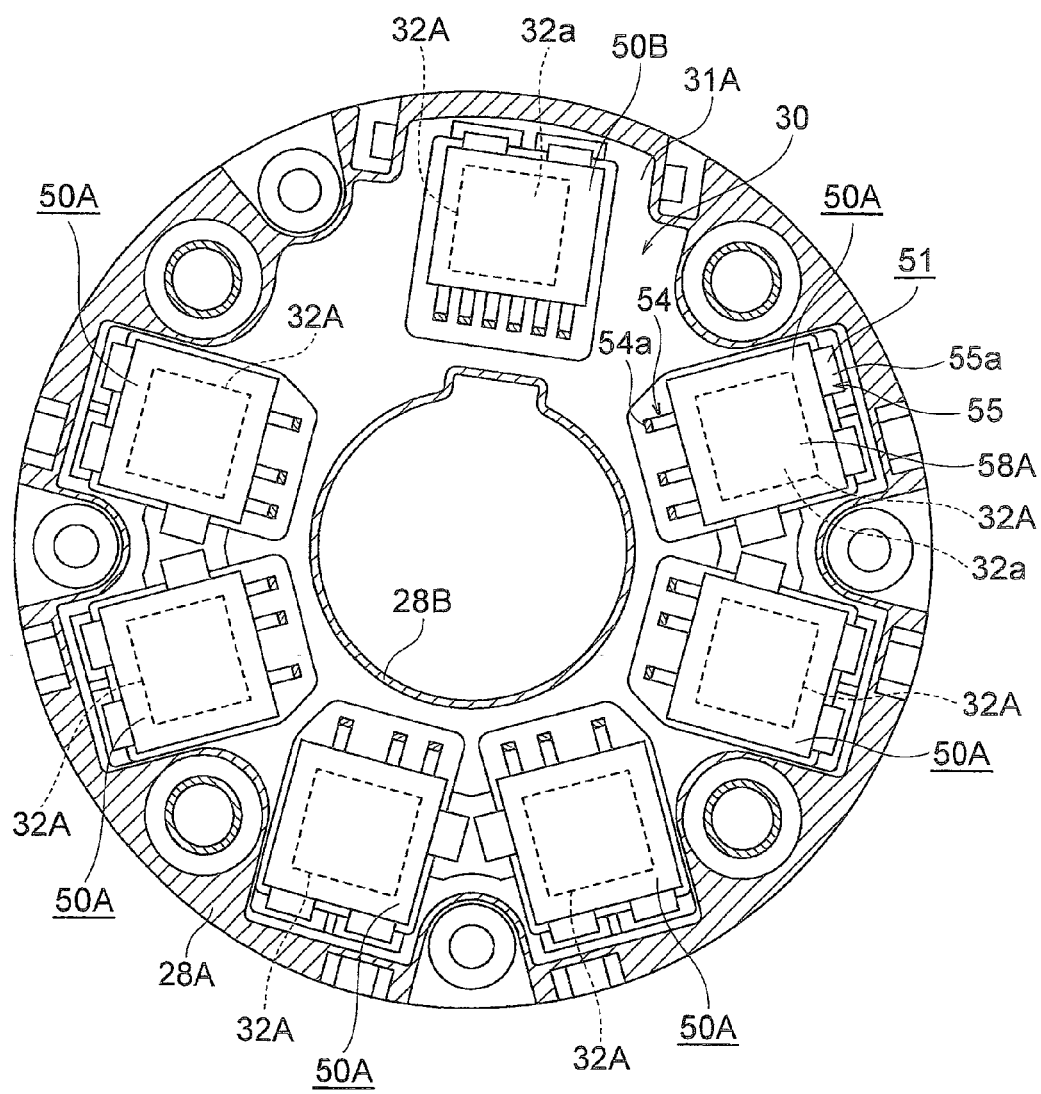
FIG. 2 is a cross section that is taken along Line II-II in FIG. 1 so as to be viewed from the direction of the arrows.
Figure 3:
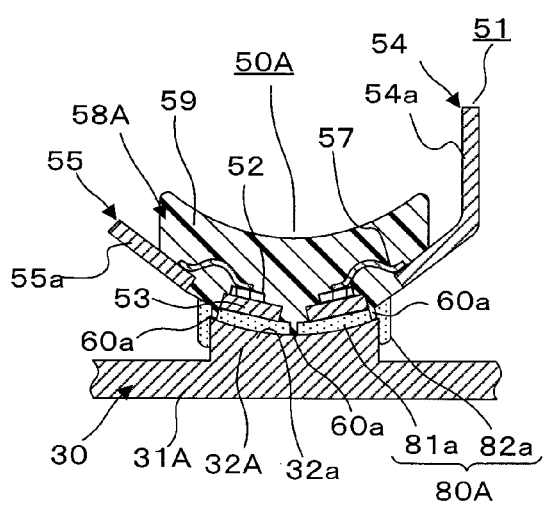
FIG. 3 is a partial enlargement of Portion A in FIG. 1.
Figure 4:
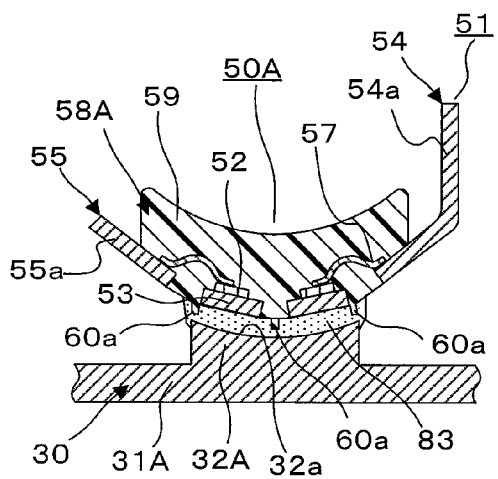
FIG. 4 is a cross section that explains work of mounting a power circuit module to a heatsink of the control apparatus-integrated dynamoelectric machine according to Embodiment 1 of the present invention.

FIG. 1 is a cross section of a control apparatus-integrated dynamoelectric machine according to Embodiment 1 of the present invention, FIG. 2 is a cross section that is taken along Line II-II in FIG. 1 so as to be viewed from the direction of the arrows, FIG. 3 is a partial enlargement of Portion A in FIG. 1, and FIG. 4 is a cross section that explains work of mounting a power circuit module to a heatsink of the control apparatus-integrated dynamoelectric machine according to Embodiment 1 of the present invention.

In FIGS. 1 through 3, a control apparatus-integrated dynamoelectric machine 1 has: a dynamoelectric machine main body 2; and a control apparatus 40 that is mounted integrally onto the dynamoelectric machine main body 2.

The dynamoelectric machine main body 2 includes: a housing 3 that is constituted by brackets 4A and 4B that are integrated using bolts 9; a rotating shaft 7 that is supported so as to be rotatable around an axis by bearings 5 and 6 that are supported by the housing 3 such that first and second ends of the rotating shaft 7 project outward from the housing 3; a rotor 10 that is fixed coaxially to the rotating shaft 7 inside the housing 3 and rotates together with the rotating shaft 7; a stator 15 that is fixed to an inner circumferential surface of the housing 3 so as to cover an outer circumferential side of the rotor 10; a resolver 26 that is mounted to the first end of the rotating shaft 7, and that detects the rotation angle of the rotor 10; and a pulley 8 that is fixed to the second end of the rotating shaft 7.

The dynamoelectric machine main body 2 includes: fans 18a and 18b that are mounted to first and second axial end portions of the rotating shaft 7 of the rotor 10; slip rings 21 that are fixed to the rotating shaft 7 at the first axial end of the rotating shaft 7 of the rotor 10, and that supply electric current to the rotor 10; and a pair of brushes 24 that are housed so as to slide in contact with the slip rings 21 in a brush holder 22 that is supported by the housing 3.

The control apparatus 40 includes: power circuit modules 50A that have switching elements 52 that switch electric current that is supplied to the stator 15 ON and OFF; a field circuit module 50B that has a switching element 52 that switches electric current that is supplied to the rotor 10 ON and OFF; a heatsink 30 to which the power circuit modules 50A and the field circuit module 50B are mounted, and that is supported by the housing 3; a control board 70 that functions as a switching element controlling means that has a control circuit portion (not shown) that outputs control signals for the switching elements 52 of the power circuit modules 50A and the field circuit module 50B; and a relay circuit board 75 that is interposed between the control board 70 and the power circuit modules 50A and the field circuit module 50B, and that connects control signal output terminals of the control board 70 and switching element control signal terminals 54a of the power circuit modules 50A and the field circuit module 50B.

In addition, the control apparatus 40 includes: module electrically insulating layers 80A that electrically insulate between the power circuit modules 50A and the heatsink 30 and between the field circuit module 50B and the heatsink 30; and case members 28A and 28B that are disposed so as to project from the heatsink 30 near an outer edge of a base plate 31A and near an insertion portion for the rotating shaft 7, and that face each other so as to have the power circuit modules 50A and the field circuit module 50B interposed.

The housing 3 forms a hollow, approximately cylindrical shape in which apertures are formed that communicate between internal and external portions at central portions of first and second axial ends. The rotating shaft 7 is supported by bearings 5 and 6 that are mounted coaxially into the housing 3.

The rotor 10 is constituted by: a field winding 11 that generates magnetic flux on passage of electric current; and a pair of pole core bodies that are disposed so as to cover the field winding 11, and in which magnetic poles form due to the magnetic flux that is generated by the field winding 11. The pair of pole core bodies are made of iron, respectively have eight, for example, claw-shaped magnetic poles disposed so as to project axially at a uniform angular pitch circumferentially on outer circumferential edges thereof, and are fixed to the shaft 7 so as to face each other so as to intermesh the claw-shaped magnetic poles.

The stator 15 includes: a stator core 16; and an armature winding 17 that is mounted to the stator core 16. The armature winding 17 is constituted by two three-phase alternating current windings that are each constituted by a star connection.

The heat sink 30 is prepared by aluminum die casting, and includes: the base plate 31A; seven convex heat-receiving portions 32A that are disposed so as to project from a front surface of the base plate 31A; and a plurality of cooling fins 33 that extend outward from a rear surface of the base plate 31A.

The convex heat receiving portions 32A are disposed so as to project from the front surface of the base plate 31A so as to be offset in a circumferential direction of the base plate 31A, and external shapes of cross sections that are perpendicular to the direction of projection are rectangular. Projecting end surfaces of the convex heat-receiving portions 32A constitute heat receiving surfaces 32a onto which either a power circuit module 50A or a field circuit module 50B can be mounted. The shapes of the heat receiving surfaces 32a are curved surfaces that are concave toward a central portion.

Now, the shape of the metal mold that is used to prepare the heatsink 30 by aluminum die casting is a simple shape that has a flat inner surface that corresponds to the heat receiving surfaces 32a of the convex heat receiving portions 32A. The heat receiving surfaces 32a of the convex heat receiving portions 32A of a heatsink 30 that is prepared by aluminum die casting using a metal mold having such a shape are formed so as to have curved surfaces that are concave toward a central portion of the heat receiving surfaces 32a, as described above.

A length of projection of the cooling fins 33 that extend outward from the rear surface of the base plate 31A that corresponds to the convex heat receiving portions 32A to which the field circuit module 50B is mounted and a region in a vicinity thereof is shorter than a length of the cooling fins 33 that extend outward from the rear surface elsewhere on the base plate 31A.

Now, a control apparatus-integrated dynamoelectric machine 1 can be mounted into an automobile engine compartment, for example. Engine compartments are required to be reduced as much as possible in order to maximize spaciousness of automotive vehicle interiors, and reductions in the size of control apparatus-integrated dynamoelectric machines 1 that can be mounted into the engine compartments are required for this.

Since the rotor 10, which constitutes a main part of the control apparatus-integrated dynamoelectric machine 1, performs rotational motion, the rotor 10 and the stator 15 can be disposed inside the housing 3 without leaving wasteful gaps by forming the housing 3 so as to have a hollow cylinder shape, aligning the center of rotation of the rotor 10 with the central axis of the housing 3, and further fixing the stator 15 to an inner circumferential surface of the housing 3. In other words, forming the housing 3 so as to have a cylindrical shape is optimal for reducing the size of the control apparatus-integrated dynamoelectric machine 1. By making the base plate 31A of the heatsink 30 a disk shape that has an outside diameter that corresponds to the inside diameter of the housing 3, the heatsink 30 can be disposed inside the housing 3 so as to use the limited space inside the housing 3 effectively.

As shown in FIGS. 2 and 3, the power circuit modules 50A include: pairs of switching elements 52 and pairs of diodes (not shown); metal frames 51 that are constituted by: a plurality of flat element heat radiating portions 53 on a front surface of each of which the switching elements 52 and diodes are mounted; first lead terminals 54 that are disposed so as to be electrically insulated from the element heat radiating portions 53, and that are used to input control signals for the switching elements 52; and second lead terminals 55 that are used for electric power transmission to and from the stator 15; wires 57 that interlink the first and second lead terminals 54 and 55, the switching elements 52, and the diodes such that the first and second lead terminals 54 and 55, the switching elements 52, and the diodes constitute an inverter unit that is described below; and molded resin layers 58A that seal the switching elements 52 and the diodes that are mounted onto the element heat radiating portions 53.

The wires 57 are prepared using a material that has superior electroconductivity such as gold, aluminum, copper, etc.

The power circuit modules 50A are configured as molded seal modules that are prepared by integrating the metal frames 51 into molded resin layers 58A that are constituted by an electrically insulating resin by transfer molding such that the switching elements 52 and the diodes that are disposed on the element heat radiating portions 53 are sealed.

As shown in FIG. 3, the molded resin layers 58A include: seal main body portions 59 that are prepared so as to be curved such that a front surface side is concave and a bottom surface side is convex, and so as to have an approximately rectangular shape when viewed from a direction in which the front surface and the bottom surface face each other (a thickness direction); and electrically insulating lugs 60a that are disposed so as to project from the bottom surfaces of the seal main body portions 59 that function as reference surfaces.

The element heat radiating portions 53 are integrated into the seal main body portions 59 such that bottom surfaces thereof are exposed without giving rise to steps relative to the bottom surfaces of the seal main body portions 59, and are surrounded by predetermined regions of central portions of the seal main body portions 59 when viewed from the thickness direction of the seal main body portions 59.

Moreover, "predetermined regions" means regions of the bottom surfaces of the seal main body portions 59 that face the heat receiving surfaces 32a when bottom surfaces of the seal main body portions 59 and the heat receiving surfaces 32a face each other such that apex portions of the bottom surfaces of the seal main body portions 59 and deepest portions of the heat receiving surfaces 32a of the convex heat receiving portions 32A are aligned, and the regions in question constitute joining regions of the seal main body portions 59.

The joining regions of the seal main body portions 59 are formed so as to be able to face the heat receiving surfaces 32a so as to leave an approximately uniform gap, and the joining regions are convex surfaces that have magnitudes of curvature that match magnitudes of curvature of the concave surfaces of the heat receiving surfaces 32a. Bottom surfaces of seal main body portions 59 that have joining regions of this kind have a shape that corresponds to the shape of the heat receiving surfaces 32a.

The electrically insulating lugs 60a are disposed so as to project from portions inside the joining regions of the seal main body portions 59 at positions other than the element heat radiating portions 53. The electrically insulating lugs 60a are disposed so as to project from central portions of the seal main body portions 59, and from portions of the seal main body portions 59 that are separated by a predetermined distance from those central portion toward mutually parallel first sides and second sides of the seal main body portions 59 when viewed from the bottom surface sides of the seal main body portions 59. A projecting length of the electrically insulating lugs 60a from the bottom surfaces of the seal main body portions 59 is described below.

The first lead terminals 54 are formed so as to have approximate L shapes, and the second lead terminals 55 are formed so as to have flat, rectangular shapes.

Three first lead terminals 54 are disposed so as to be separated from each other in a longitudinal direction on first sides of the bottom surfaces of the seal main body portions 59, and are integrated into the seal main body portions 59 such that tip end portions on second ends of the first lead terminals 54 (first end portions of the first lead terminals 54) are exposed on the bottom surfaces of the seal main body portions 59. First ends of the first lead terminals 54 are disposed so as to extend from the bottom surfaces of the seal main body portions 59 toward the front surfaces, and constitute signal terminals 54a.

Two second lead terminals 55 are disposed so as to be separated from each other in a longitudinal direction on second sides of the bottom surfaces of the seal main body portions 59, and are integrated into the seal main body portions 59 such that first long side portions of the second lead terminals 55 (first end portions of the second lead terminals) are exposed on the bottom surfaces of the seal main body portions 59. Second long side portions of the second lead terminals 55 are disposed so as to extend outside the seal main body portions 59, and constitute power wiring terminals 55a.

Now, the coefficients of linear expansion of the materials in the molded resin layers 58A and the metal frames 51 are different, and the electrically insulating resin that seals the switching elements 52 and the diodes contracts during transfer molding. For this reason, the power circuit modules 50A, which are prepared by transfer molding so as to expose the element heat radiating portions 53, the first lead terminals 54, and the second lead terminals 55 on the bottom surfaces of the seal main body portions 59, become curved such that the front surfaces and bottom surfaces of the seal main body portions 59 become concave surfaces and convex surfaces, as described above.

The element heat radiating portions 53, the second ends of the first lead terminals 54 (opposite ends from the signal terminals 54a), and the second lead terminals 55 that have been disposed in a common plane, are integrated into the seal main body portions 59 so as to be exposed on the curved bottom surfaces of the seal main body portions 59 without giving rise to steps. Thus, the bottom surfaces of the power circuit modules 50A are constituted by the bottom surfaces of the seal main body portions 59, the bottom surfaces of the element heat radiating portions 53, and the first lead terminals 54 and the second lead terminals 55 that are exposed on the bottom surfaces of the seal main body portions 59.

Now, large portions of volumes of the seal main body portions 59 are on the front surface sides of the element heat radiating portions 53, and the curved shapes of the front surfaces and the bottom surfaces of the seal main body portions 59 become gentle or become steep by increasing or decreasing the volumes of the seal main body portions 59 on the front surface sides of the element heat radiating portions 53. The volumes of the seal main body portions 59 on the front surface sides of the element heat radiating portions 53 are set such that the bottom surfaces of the seal main body portions 59, in other words, the curved shape of the bottom surfaces of the power circuit modules 50A, approximately match the curved shape of the heat receiving surfaces 32a of the convex heat receiving portions 32A.

The power circuit modules 50A are configured in the above manner.

The field circuit module 50B is also configured in a similar manner to that of the power circuit modules 50A. However, six first lead terminals 54 are integrated into the molded resin layer 58A.

As shown in FIG. 1, the relay circuit board 75 is configured so as to be mountable so as to extend circumferentially alongside the base plate 31A near projecting ends of the case members 28A and 28B. In addition, the relay circuit board 75 is configured so as to be linkable with the power circuit modules 50A and the signal terminals 54a (signal input terminals) of the field circuit module 50B that are mounted to each of the convex heat receiving portions 32A. The control board 70 and the relay circuit board 75 are configured so as to be linkable by means of connectors 77. The relay circuit board 75 has a wiring pattern that connects the linked portions of each of the signal terminals 54a and the linked portions of the connectors 77.

By linking the control board 70 with the power circuit modules 50A and the field circuit module 50B by means of the relay circuit board 75 and the connectors 77, the control board 70 enables control signals to be output to the signal terminals 54a of the power circuit modules 50A and the field circuit module 50B.

Next, details of a construction for integrating the stator 15, the rotor 10, the control apparatus 40, etc., to the housing 3 will be explained.

The rotating shaft 7 is inserted coaxially into the base plate 31A of the heatsink 30, and the base plate 31A is supported in the housing 3 such that a front surface side is oriented toward the first axial end of the rotating shaft 7.

As shown in FIG. 3, the power circuit modules 50A are disposed such that the apex portions of the bottom surfaces thereof and the deepest portions of the heat receiving surfaces 32a of the convex heat receiving portions 32A are aligned, and the electrically insulating lugs 60a are placed in contact with the heat receiving surfaces 32a. The positions of disposition of the power circuit modules 50A at this time constitute predetermined mounting positions relative to the convex heat receiving portions 32A. The power circuit modules 50A are fixed to the convex heat receiving portions 32A such that electrical insulation from the convex heat receiving portions 32A is maintained by the module electrically insulating layer 80A.

Here, the module electrically insulating layers 80A are formed by the following procedure. First, an electrically insulating adhesive 83 is applied to the heat receiving surfaces 32a of the convex heat receiving portions 32A so as to be thicker than the projecting lengths of the electrically insulating lugs 60a, and the power circuit modules 50A are disposed such that the electrically insulating lugs 60a are oriented toward the electrically insulating adhesive 83, as shown in FIG. 4. At this point, first ends of the first lead terminals 54 and first ends of the second lead terminals 55 are positioned outside the convex heat receiving portions 32A when viewed from the direction of projection of the convex heat receiving portions 32A.

In addition, the power circuit modules 50A are pushed onto the heat receiving surfaces 32a until the electrically insulating lugs 60a are placed in contact with the heat receiving surfaces 32a, as shown in FIG. 3. At this point, a portion of the electrically insulating adhesive 83 exudes from outer edges of the heat receiving surfaces 32a of the convex heat receiving portions 32A, and is disposed between outer edges of the joining regions of the power circuit modules 50A and side surfaces of the projecting ends of the convex heat receiving portions 32A.

If necessary, electrically insulating adhesive is added between bottom surfaces of the power circuit modules 50A at the outer edges of the joining regions of the heat receiving surfaces 32a and the side surfaces of the projecting ends of the convex heat receiving portions 32A. The electrically insulating adhesive 83 hardens in this state to constitute the module electrically insulating layers 80A. The module electrically insulating layers 80A that are formed in this manner have: electrical insulation supporting layers 81a that are interposed between the heat receiving surfaces 32a and the power circuit modules 50A, and that electrically insulate between the heat receiving surfaces 32a and the bottom surfaces of the element heat radiating portions 53; and outer electrically insulating layers 82a that are formed so as to span between the side surfaces of the projecting ends of the convex heat receiving portions 32A and portions of the seal main body portions 59 outside the joining regions.

Thickness of the electrical insulation supporting layers 81a is equal to the projecting length of the electrically insulating lugs 60a from the bottom surfaces of the seal main body portions 59. The projecting length of the electrically insulating lugs 60a from the bottom surfaces of the seal main body portions 59 is set such that the electrical insulation supporting layers 81a satisfy electrical insulating conditions described below when the power circuit modules 50A and the field circuit module 50B are disposed such that the electrically insulating lugs 60a are placed in contact with the heat receiving surfaces 32a.

The electrical insulating conditions are namely: ensuring electrical insulation between the heat receiving surfaces 32a and the bottom surfaces of the element heat radiating portions 53; and having heat radiating performance such that heat is radiated from the switching elements 52 to the convex heat receiving portions 32A such that the temperature of the switching elements 52 does not exceed a permissible upper limit temperature that is predefined by a specification.

Moreover, it is necessary to set the thickness of the electrical insulation supporting layers 81a for ensuring electrical insulation between the heat receiving surfaces 32a and the bottom surfaces of the element heat radiating portions 53 so as to be greater than or equal to an electrical insulation supporting distance that will now be explained.

The electrical insulation supporting distance is a minimum value of creepage distance of an electrical insulation supporting layer 81a along a void that has arisen when the electrically insulating adhesive 83 hardened, at which electrical insulation between the element heat radiating portions 53 and the heat receiving surfaces 32a can be ensured even if the bottom surface of the element heat radiating portion 53 and the heat receiving surface 32a are communicated due to the void.

The field circuit module 50B is fixed in a similar manner to a heat receiving surface 32a of the convex heat receiving portions 32A to which the power circuit modules 50A are not mounted.

As shown in FIG. 1, the relay circuit board 75 is mounted near the projecting ends of the case members 28A and 28B, and although not shown, the relay circuit board 75 is fixed integrally onto the case members 28A and 28B by sealing a space surrounded by the case members 28A and 28B and the heatsink 30 in a resin. The control board 70 is supported by an external portion of the housing 3, and is linked to the relay circuit board 75 by means of the connectors 77.

By using the relay circuit board 75 and the connectors 77, wiring that connects each of the signal terminals 54a and each of the control signal output terminals of the control board 70 is no longer necessary, facilitating electrical connection between the control board 70 and each of the signal terminals 54a.

As shown in FIG. 1, first ends of connecting terminals 90 are inserted through the case member 28A, and although not shown in detail, are connected to the power wiring terminals 55a of the power circuit modules 50A. A relay base 91 is mounted to a portion of the heatsink 30 near the cooling fins 33 that correspond to each of the power circuit modules 50A, and second ends of the connecting terminals 90 are linked to the relay base 91. End portions of output wires 92 of each of the three-phase alternating-current windings that constitute the armature winding 17 are linked to the relay base 91 such that the connecting terminals 90 are electrically connected to the output wires 92.

By leading around the output wires 92, mounting positions of each of the power circuit modules 50A on the heatsink 30 can be set freely because it becomes possible to connect the corresponding power circuit modules 50A and coil ends.

Connecting terminals (not shown) that connect the brush holder 22 and the power wiring terminals 55a of the field circuit module 50B are also disposed. These connecting terminals are prepared so as to have shapes that have U-shaped bend portions, for example, and because stresses acting on the connecting terminals due to the brush holder 22 and the field circuit module 50B vibrating are absorbed by the bend portions, vibration resistance of the connecting terminals is improved.

Cooling airflow paths are formed in a space between the fans 18a and the heatsink 30 in which the brush holder 22, and the relay base 91, etc., are disposed, such that the heatsink 30 is cooled efficiently by air that flows through the cooling airflow path.

The brush holder 22 is disposed in a space that is secured by shortening the length of projection of the cooling fins 33 from the base plate 31A. By shortening the length of projection of the cooling fins 33 from the base plate 31A, heat radiating area of the cooling fins 33 decreases, and heat radiation deteriorates in the portion that has shortened cooling fins 33. However, because the heat sink 30 is a solid part integrating portions that receive the heat from the power circuit modules 50A, heat is diffused to portions where there are other cooling fins 33 without concentrating in the portion that has cooling fins 33 that have inferior heat radiation. For this reason, heat that is generated by the field circuit module 50B is also radiated from the heatsink 30 without any problem.

Now, the magnitude of voltage that is used in a control apparatus-integrated dynamoelectric machine 1 that is mounted to and used in an automobile is generally not greater than or equal to 100 V. For this reason, electrical insulation between the convex heat receiving portions 32A and the bottom surfaces of the element heat radiating portions 53 can be ensured if the thicknesses of the electrical insulating supporting layers 81a is approximately 20 μm.

Dimensional errors in molded resin layers 58A that are prepared by transfer molding result from milling precision of the metal mold that is used in the transfer molding, but can be suppressed to the order of several μm. For this reason, the electrically insulating lugs 60a can be formed easily while suppressing irregularities in the dimensions of the electrically insulating lugs 60a if molded together with the seal main body portions 59 by transfer molding. Thus, allowing for dimensional errors in the molded resin layers 58A, a metal mold shape that is used in the transfer molding is determined such that the projecting lengths of the electrically insulating lugs 60a from the seal main body portions 59 are not less than 20 μm.

Next, a system configuration for the control apparatus-integrated dynamoelectric machine 1 will be explained with reference to the drawings.

Figure 5:
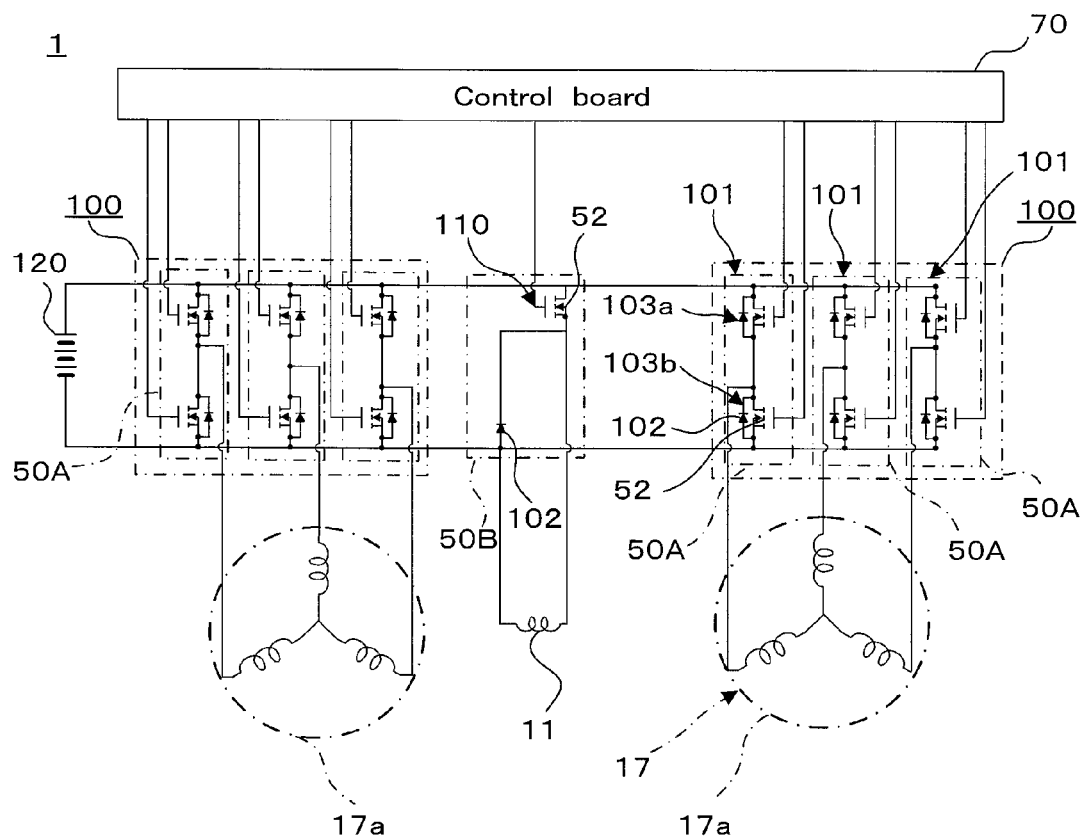
FIG. 5 is a system configuration diagram for the control apparatus-integrated dynamoelectric machine according to Embodiment 1 of the present invention.

FIG. 5 is a system configuration diagram for the control apparatus-integrated dynamoelectric machine according to Embodiment 1 of the present invention.

In FIG. 5, the system of the control apparatus-integrated dynamoelectric machine 1 includes: an armature winding 17 that has a pair of three-phase alternating-current windings 17a that are each constituted by a star connection; a field winding 11; a control board 70 that outputs a control signal for electric current to the three-phase alternating-current windings 17a; a pair of inverter units 100 are respectively connected to each of the three-phase alternating-current windings 17a, and that supply electric power to the three-phase alternating-current windings 17a in response to the control signal that is output from the control board 70, rectify output current from the three-phase alternating-current windings 17a, etc.; a field circuit portion 110 that is constituted by a switching element 52 of a field circuit module 50B and a diode 102, and that supplies electric power to the field winding 11 in response to the control signal from the control board 70; and a battery 120 that is charged by electric power that is supplied from the three-phase alternating-current windings 17a by means of the inverter units 100.

Each of the inverter units 100 is disposed so as to be aligned with the respective three-phase alternating-current windings 17a.

The inverter units 100 are configured by connecting in parallel three power circuit portions 101 that are constituted by switching elements 52 of power circuit modules 50A and diodes 102.

The power circuit portions 101 have: an upper arm 103a that is constituted by a switching element 52 and the diode 102 that are connected in parallel; and a lower arm 103b that is similar to the upper arm 103a. The upper arm 103a and the lower arm 103b are connected such that the switching elements 52 are in series. Here, the upper arm 103a is connected to a high electric potential side of the battery 120, and the lower arm 103b is connected to a low electric potential side of the battery 120.

Connected portions (intermediate electric potential terminals) of the upper arm 103a and the lower arm 103b of each of the power circuit portions 101 and coil ends of the phase windings of the three-phase alternating-current windings 17a are connected by means of alternating-current wiring. Signal terminals (not shown), into which control signals are input that switch the switching elements 52 ON and OFF, and the control board 70 are connected.

The field circuit portion 110 is configured by connecting the switching element 52 of the field circuit module 50B and a diode 102 in series. The switching element 52 is connected to the high electric potential side of the battery 120, and the diode 102 is connected to the low electric potential side of the battery 120. The field winding 11 is connected in parallel to the diode 102.

A control apparatus-integrated dynamoelectric machine 1 that is configured in the above manner has functions as both an electric motor and a generator.

First, operation as an electric motor will be explained. When starting an engine (not shown), direct-current power is supplied to the inverter units 100 from the battery 120. The control circuit portion that is mounted to the control board 70 controls switching ON and OFF of the switching elements 52 of each of the inverter units 100 such that the direct current that has been input from the battery 120 to the inverter units 100 is converted to three-phase alternating-current and is supplied to the three-phase alternating-current windings 17a.

Rotating magnetic fields are generated around the field winding 11 to which electric current that corresponds to the control signal that is input from the control board 70 is being supplied, rotating the rotor 10 (see FIG. 1). Torque from the rotor 10 is transmitted to the engine from the pulley 8 (see FIG. 1) by means of a belt (not shown) to start the engine.

Next, operation as a generator will be explained.

Once the engine has been started, torque from the engine is transmitted to the rotating shaft 7 by means of a crank shaft (not shown), the belt, and the pulley 8. The rotor 10 is thereby rotated, inducing a three-phase alternating-current voltage in the three-phase alternating-current windings 17a of the armature winding 17. Then, the control circuit that is mounted to the control board 70 controls switching ON and OFF of the switching elements 52 of the inverter units 100 so as to convert the three-phase alternating-current power that is induced in the three-phase alternating-current windings 17a into direct-current power, and the battery 120 is charged by this direct-current power.

According to Embodiment 1, the power circuit modules 50A and the field circuit module 50B each include: a switching element 52; an element heat radiating portion 53 to which the switching element 52 is mounted; and a seal main body portion 59 that is made of an insulating resin that seals the switching element 52 so as to expose bottom surfaces of the element heat radiating portion 53 on a bottom surface (a reference surface) that has a surface shape that corresponds to the shape of a heat receiving surface 32a. A heatsink 30 has a plurality of convex heat receiving portions that are each disposed so as to project from a front surface of a base plate 31A such that projecting end surfaces constitute the heat receiving surfaces 32a.

The power circuit modules 50A and the field circuit module 50B are each disposed such that the bottom surface of the element heat radiating portion 53 is directed toward the respective heat receiving surfaces 32a of the convex heat receiving portions 32A, and an electrical insulation supporting layer 81a is interposed between the bottom surface of the heat receiving surface 32a and the element heat radiating portion 53.

Because the heatsink 30 is prepared so as to have a shape that has respective convex heat receiving portions for mounting each of the power circuit modules 50A and the field circuit module 50B, the heat receiving surfaces 32a of the respective convex heat receiving portions 32A have a small area. Thus, the heat receiving surfaces 32a of the respective convex heat receiving portions 32A can be formed so as to have an approximately uniform shape even if the heatsink 30 is prepared by die casting, enabling use of power circuit modules 50A and a field circuit module 50B that are mounted so as to face the respective heat receiving surfaces 32a of the respective convex heat receiving portions 32A that each have bottom portions that have an identical shape. In other words, power circuit modules 50A and a field circuit module 50B that are prepared using a common molding step can be mounted without leaving large gaps relative to heat receiving surfaces 32a of respective convex heat receiving portions 32A.

Now, if portions of wall surfaces of a metal mold used in aluminum die casting that correspond to the heat receiving surfaces 32a of the convex heat receiving portions 32A are made conventionally flat, the surface shape of the heat receiving surfaces 32a of the convex heat receiving portions 32A that are prepared are curved surfaces that are centrally concave.

By preparing the bottom surfaces of the seal main body portions 59 so as to form curved surfaces that conform to the surface shape of the heat receiving surfaces 32a, for example, the power circuit modules 50A and the field circuit module 50B can be mounted to the convex heat receiving portions 32A without leaving large gaps relative to the heat receiving surfaces 32a. Because the thickness of an interposed electrical insulation supporting layer 81a between the element heat radiating portion 53 and the convex heat receiving portions 32A can thereby be made thinner, increases in thermal resistance of the electrical insulation supporting layer 81a can be suppressed, enabling heat from the switching elements 52 to be radiated to the heatsink 30 smoothly.

In addition, because the shape of the heat receiving surfaces 32a of the convex heat receiving portions 32A to which the power circuit modules 50A and the field circuit module 50B are mounted is an approximately uniform shape, the plurality of power circuit modules 50A and the field circuit module 50B can be prepared by a molding process that uses a common mold. Consequently, costs for manufacturing the power circuit modules 50A and the field circuit module 50B can be reduced. Because cutting processes for the heatsink 30 are also no longer necessary, costs for manufacturing the heatsink 30 can also be kept inexpensive. In other words, costs for manufacturing the control apparatus-integrated dynamoelectric machine 1 can be suppressed.

Electrically insulating lugs 60a are disposed so as to project from bottom surfaces of the power circuit modules 50A and the field circuit module 50B that face the heat receiving surfaces 32a of the convex heat receiving portions 32A. If the power circuit modules 50A and the field circuit module 50B are disposed on the heat receiving surfaces 32a to which an electrically insulating adhesive has been applied in advance such that the electrically insulating lugs 60a come into contact with the heat receiving surfaces 32a, thickness of electrical insulation supporting layers 81a between the bottom surfaces of the element heat radiating portions 53 and the heat receiving surfaces 32a is equal to a projecting length of the electrically insulating lugs 60a. In other words, thickness of the electrical insulation supporting layers 81a can be controlled to a thickness that corresponds to the projecting length of the electrically insulating lugs 60a.

The projecting length of the electrically insulating lugs 60a from the bottom surfaces of the seal main body portions 59 is set such that the electrical insulating supporting layers 81a satisfy the electrical insulating conditions described above when the power circuit modules 50A and the field circuit module 50B are disposed such that the electrically insulating lugs 60a are placed in contact with the heat receiving surfaces 32a.

Consequently, by disposing the power circuit modules 50A and the field circuit module 50B that have the electrically insulating lugs 60a such that the electrically insulating lugs 60a are placed in contact with the heat receiving surfaces 32a, electrical insulation between the heat receiving surfaces 32a of the convex heat receiving portions 32A and the element heat radiating portions 53 can be reliably prevented from being broken while suppressing significant increases in thermal resistance of the electrical insulation supporting layers 81a.

The power circuit modules 50A include: an upper arm 103a and a lower arm 103b that each have a switching element 52, and that are connected such that the switching elements 52 are in series, and are configured such that the upper arm 103a and the lower arm 103b are sealed in a common seal main body portion 59 of a molded resin layer 58A during molding of the power circuit modules 50A. Thus, if a terminal that has an electric potential equal to that of the terminals of the switching elements 52 of the upper arm 103a and the lower arm 103b that are linked inside the common seal main body portion 59 (the intermediate electric potential terminal) is left exposed on an external portion of the seal main body portion 59, the coil ends of the three-phase alternating-current windings 17a and the intermediate electric potential terminals can be connected.

Now, if the upper arm 103a and the lower arm 103b are each sealed into different seal main body portions of molded resin layers, it is necessary to connect the upper arm 103a and the lower arm 103b later, making it necessary to leave terminals for connecting the switching element 52 of the upper arm 103a and the lower arm 103b in series (intermediate electric potential terminals) exposed on each of the different molded resin layers.

On the other hand, if the upper arm 103a and the lower arm 103b are sealed into a common seal main body portion 59, as in the power circuit modules 50A, the power circuit modules 50A can be reduced in size because the number of terminals is reduced.

Moreover, in Embodiment 1, the electrical insulation supporting layers 81a have been explained as being a hardened electrically insulating adhesive, but insulating sheets, etc., may also be used as electrical insulation supporting layers.

However, as has been described above, if the control apparatus-integrated dynamoelectric machine 1 is mounted onto an automobile, electrical insulation between the heat receiving surfaces 32a of the convex heat receiving portions 32A and the bottom surfaces of the element heat radiating portions 53 can be ensured if the thickness of the electrical insulation supporting layers 81a is approximately 20 μm. If the projecting length of the electrically insulating lugs 60a from the bottom surfaces of the seal main body portion 59 is controlled such that the electrical insulation supporting layers 81a are as thin as possible at a length that ensures electrical insulation between the heat receiving surfaces 32a and the bottom surfaces of the element heat radiating portions 53, the electrical insulation supporting layers 81a will not become unnecessarily thick. For this reason, it is only necessary to harden an inexpensive electrically insulating adhesive at a thin thickness, rather than having to use conventional expensive insulating sheets that are superior in thermal conductivity as the module electrically insulating layers 80A, thereby enabling reductions in manufacturing costs.

The electrically insulating lugs 60a are prepared as part of the molded resin layers 58A that are configured by transfer molding, but the electrically insulating lugs 60a may also be omitted, the power circuit modules 50A and 50B configured by transfer molding, and electrically insulating lugs 60a that are separate members that are made of an electrically insulating material disposed so as to protrude from the seal main body portion 59 in a separate step.

The electrically insulating lugs 60a are not limited to the projecting positions described above, and need only be arbitrarily set within the joining regions of the seal main body portion 59.

The electrically insulating lugs 60a are explained as being pushed onto the heat receiving surfaces 32a, but the electrically insulating lugs 60a are not necessarily limited to being pushed onto the heat receiving surfaces 32a, the electrical insulation supporting layers 81a may also be thicker than the projecting length of the electrically insulating lugs 60a if there are no problems with the thermal conduction between the element heat radiating portion 53 and the heat receiving surfaces 32a of the convex heat receiving portions 32A.

Electrically insulating lugs 60a are explained as being disposed, but the electrically insulating lugs 60a do not need to be disposed provided that the electrical insulation supporting layers 81a can be prepared to a suitable thickness so as to maintain the electrical insulation supporting distance reliably.

The heat receiving surfaces 32a are explained as being configured as curved surfaces that are concave toward central portions, but heat receiving surfaces may also be configured into curved surfaces in which deepest portions are offset from center, for example.

Embodiment 2

Figure 6:
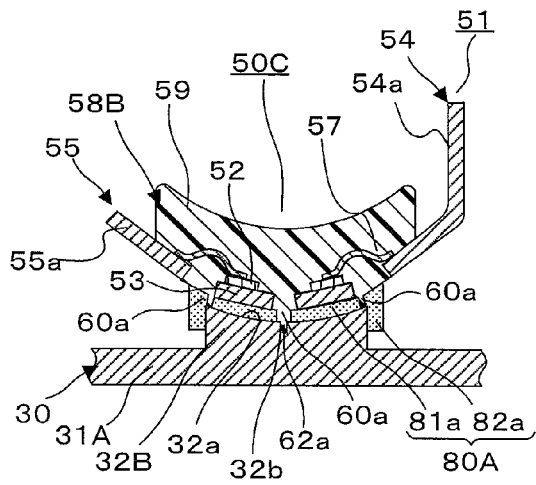
FIG. 6 is a cross section that explains a construction for mounting a power circuit module to a heatsink of a control apparatus-integrated dynamoelectric machine according to Embodiment 2 of the present invention.

FIG. 6 is a cross section that explains a construction for mounting a power circuit module to a heatsink of a control apparatus-integrated dynamoelectric machine according to Embodiment 2 of the present invention.

Moreover, in FIG. 6, portions identical to or corresponding to those in Embodiment 1 will be given identical numbering, and explanation thereof will be omitted.

In FIG. 6, a heatsink 30 has convex heat receiving portions 32B instead of the convex heat receiving portions 32A. The convex heat receiving portions 32B are configured in a similar manner to the convex heat receiving portions 32A except for having interfitting recess portions 32b that have circular cross sections that have openings at central portions of heat receiving surfaces 32a thereof, and that have depth directions oriented in a direction of projection of the convex heat receiving portions 32B from a base plate 31A.

Power circuit modules 50C are configured in a similar manner to the power circuit modules 50A except for having molded resin layers 58B instead of the molded resin layers 58A.

The molded resin layers 58B are configured in a similar manner to the molded resin layers 58A except for having positioning salient portions 62a that have circular cross sections that are disposed so as to project coaxially to electrically insulating lugs 60a that have circular cross sections which are disposed so as to project from central portions of bottom surfaces of seal main body portions 59.

The interfitting recess portions 32b and the positioning salient portions 62a are in a positional relationship so as to face each other when the power circuit modules 50C and the heat receiving surfaces 32a are made to face each other such that apex portions of bottom surfaces of the power circuit modules 50C are aligned with deepest portions of the heat receiving surfaces 32a.

Diameters of the positioning salient portions 62a are smaller than diameters of the electrically insulating lugs 60a, and correspond to inside diameters of the interfitting recess portions 32b.

Although not shown in detail, field circuit modules have positioning salient portions that are similar to the positioning salient portions 62a.

The power circuit modules 50C are disposed by fitting the positioning salient portions 62a together with the interfitting recess portions 32b, and placing leading end surfaces of the electrically insulating lugs 60a that are disposed so as to extend radially outside the positioning salient portions 62a from the base ends of the positioning salient portions 62a in contact with the heat receiving surfaces 32a.

Although not shown, a field circuit module is mounted to a corresponding convex heat receiving portion in a similar manner.

A remainder of the configuration of the control apparatus-integrated dynamoelectric machine is similar to that of Embodiment 1.

According to Embodiment 2, the heat receiving surfaces 32a of the convex heat receiving portions 32B have a small area in a similar manner to Embodiment 1, enabling similar effects to those in Embodiment 1 to be achieved.

In addition, the power circuit modules 50C and the field circuit module are disposed at predetermined positions relative to the corresponding convex heat receiving portions 32B when the positioning salient portions 62a and the interfitting recess portions 32b are fitted together with each other. Consequently, in addition to the effects in Embodiment 1, effects can be achieved that enable the power circuit modules 50C and the field circuit module to be disposed easily at predetermined positions relative to the heat receiving surfaces 32a of the convex heat receiving portions 32B simply by inserting the positioning salient portions 62a into the interfitting recess portions 32b, and placing the electrically insulating lugs 60a in contact with the heat receiving surfaces 32a.

Moreover, in Embodiment 2, the interfitting recess portions 32b are explained as being formed so as to have openings at central portions of the heat receiving surfaces 32a, and the positioning salient portions 62a as being disposed so as to project from electrically insulating lugs 60a that are disposed so as to project from central portions of bottom surfaces of the seal main body portion 59, but the interfitting recess portions 32b and the positioning salient portions 62a are not limited to these positions.

It is sufficient if the interfitting recess portions 32b are formed on the convex heat receiving portions 32B so as to have openings inside regions of the heat receiving surfaces 32a that face the projecting ends of the electrically insulating lugs 60a, and the positioning salient portions 62a are disposed so as to project from the electrically insulating lugs 60a so as to be able to fit together with the interfitting recess portions 32b, when the power circuit modules 50C and the field circuit module are disposed at predetermined positions relative to the convex heat receiving portions 32B.

Embodiment 3

Figure 7:
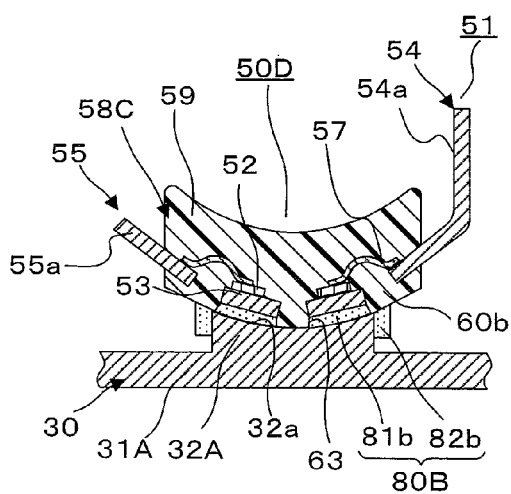
FIG. 7 is a cross section that explains a construction for mounting a power circuit module to a heatsink of a control apparatus-integrated dynamoelectric machine according to Embodiment 3 of the present invention.

FIG. 7 is a cross section that explains a construction for mounting a power circuit module to a heatsink of a control apparatus-integrated dynamoelectric machine according to Embodiment 3 of the present invention.

Moreover, in FIG. 7, portions identical to or corresponding to those in Embodiment 1 will be given identical numbering, and explanation thereof will be omitted.

In FIG. 7, power circuit modules 50D are configured in a similar manner to the power circuit modules 50A except for having molded resin layers 58C instead of the molded resin layers 58A.

The power circuit modules 50D and convex heat receiving portions 32A are electrically insulated by module electrically insulating layers 80B.

In FIG. 7, the molded resin layers 58C are constituted by: seal main body portions 59 that pass beyond predetermined positions in a thickness direction thereof, and that are configured between front surfaces and reference surfaces that have a surface shape that corresponds to a shape of heat receiving surfaces 32a of the convex heat receiving portions 32A; and electrically insulating lugs 60b that are disposed so as to project to a predetermined projecting length relative to the reference surfaces.

In other words, portions of the seal main body portions 59 that constitute base ends of the electrically insulating lugs 60b constitute reference surfaces. The reference surfaces are set so as to have a convex surface that has a magnitude of curvature that match a magnitude of curvature of a concave surface of the heat receiving surfaces 32a, and the surface shape of the reference surfaces that are set in this manner is a surface shape that corresponds to the heat receiving surfaces 32a.

Element heat radiating portions 53, and first lead terminals 54 and second lead terminals 55 are configured integrally into the molded resin layers 58C such that bottom surfaces of the element heat radiating portions 53 are exposed at the reference surfaces, and the first lead terminals 54 and second lead terminals 55 are each disposed on sides near the seal main body portions 59 such that portions in a predetermined range from first ends to second end portions of each are flush with the reference surfaces.

Here, when the molded resin layers 58C are viewed from a side near the projecting end of the electrically insulating lugs 60b, the electrically insulating lugs 60b are disposed so as to project from entire regions of the seal main body portions 59 outside the element heat radiating portions 53, and first end portions of the first lead terminals 54 and the second lead terminals 55 are embedded in the integrated electrically insulating lugs 60b and seal main body portions 59. Joining recess portions 63 that have a depth direction that is oriented in a direction that is approximately perpendicular to the bottom surfaces of the element heat radiating portions 53 are formed by wall surfaces of the electrically insulating lugs 60b that project outward from peripheral edges of the element heat radiating portions 53 and the bottom surfaces of the element heat radiating portions 53. The projecting ends of the electrically insulating lugs 60b are disposed on common curved surfaces that are approximately parallel to the reference surfaces. Thus, bottom surfaces of the power circuit modules 50D that match surfaces that include the projecting end surfaces of the electrically insulating lugs 60b are constituted by curved surfaces that have shapes that approximately match the curved shape of the heat receiving surfaces 32a.

Although not shown, molded resin layers of a field circuit module are prepared in a similar manner to that of the power circuit modules 50D.

Power circuit modules 50D that have been configured as above are disposed such that the apex portions of bottom surface sides thereof are aligned with the deepest portions of the heat receiving surfaces 32a of the convex heat receiving portions 32A, and the projecting ends of the electrically insulating lugs 60b are placed in contact with the heat receiving surfaces 32a of the convex heat receiving portions 32A.

Here, the module electrically insulating layers 80B are formed by the following procedure.

An electrically insulating adhesive is applied to the heat receiving surfaces 32a of the convex heat receiving portions 32A so as to be thicker than a depth of the joining recess portions 63, and then the power circuit modules 50D are pushed into the heat receiving surfaces 32a such that the projecting ends of the electrically insulating lugs 60b are placed in contact with the heat receiving surfaces 32a of the convex heat receiving portions 32A. At this point, electrically insulating adhesive 83 other than the electrically insulating adhesive 83 that fills the joining recess portions 63 overflows outside the heat receiving surfaces 32a of the convex heat receiving portions 32A, and spreads so as to connect side surfaces of the projecting ends of the convex heat receiving portions 32A and a vicinity of outer edges of regions of the electrically insulating lugs 60b that face the convex heat receiving portions 32A.

The electrically insulating adhesive 83 hardens in this state to constitute the module electrically insulating layers 80B. Specifically, the module electrically insulating layers 80B have: electrical insulation supporting layers 81b that fill the joining recess portions 63, and that electrically insulate between the heat receiving surfaces 32a and the bottom surfaces of the element heat radiating portions 53; and outer electrically insulating layers 82b that are disposed outside the heat receiving surfaces 32a, and that connect the side surfaces of the projecting ends of the convex heat receiving portions 32A and outer edges of portions of the electrically insulating lugs 60b that face the convex heat receiving portions 32A.

The thickness of the electrical insulation supporting layers 81b that fill the joining recess portions 63 is equal to the projecting length of the electrically insulating lugs 60b from the reference surfaces, and the projecting length of the electrically insulating lugs 60b from reference surfaces is set in a similar manner to the projecting length of the electrically insulating lugs 60a from the bottom surfaces of the seal main body portions 59 described above.

Although not shown, a field circuit module is mounted to a corresponding convex heat receiving portion in a similar manner.

A remainder of the configuration of the control apparatus-integrated dynamoelectric machine is similar to that of Embodiment 1.

According to Embodiment 3, the heat receiving surfaces 32a of the convex heat receiving portions 32A have a small area in a similar manner to Embodiment 1, enabling similar effects to those in Embodiment 1 to be achieved.

Because the electrically insulating lugs 60b are disposed so as to project from all over the seal main body portions 59 except at positions of disposition of the element heat radiating portions 53 such that the element heat radiating portions 53 are exposed when the molded resin layers 58C are viewed from the thickness direction, the area of the electrically insulating lugs 60b that is placed in contact with the heat receiving surfaces 32a is increased compared to the electrically insulating lugs 60a, which are disposed so as to project from portions of the bottom surfaces of the seal main body portions 59 as shown in Embodiment 1 above. If the amount of electrically insulating adhesive that is applied to the heat receiving surfaces 32a when fixing the power circuit modules 50D and the field circuit module to the heat receiving surfaces 32a is equal to that in Embodiment 1, the amount of electrically insulating adhesive that exudes to side surface portions of the respective convex heat receiving portions 32A is increased, increasing the volume of the outer electrically insulating layers 82b. Consequently, in addition to the effects in Embodiment 1, effects can be expected that enable creepage distance between the first lead terminals 54 and the second lead terminals 55 that extend outward from the molded resin layers 58C and the convex heat receiving portions 32A to be lengthened without consuming electrically insulating adhesive wastefully.

Embodiment 4

Figure 8:
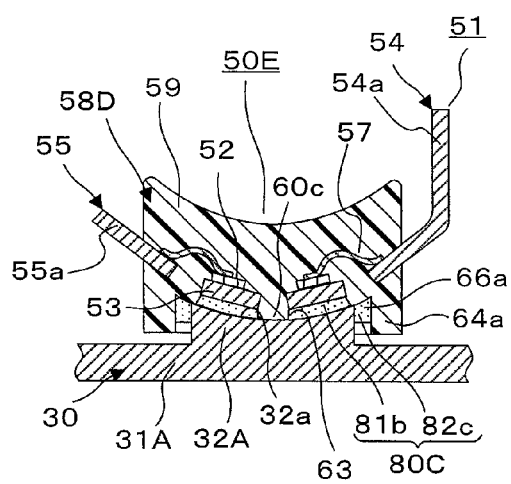
FIG. 8 is a cross section that explains a construction for mounting a power circuit module to a heatsink of a control apparatus-integrated dynamoelectric machine according to Embodiment 4 of the present invention.

FIG. 8 is a cross section that explains a construction for mounting a power circuit module to a heatsink of a control apparatus-integrated dynamoelectric machine according to Embodiment 4 of the present invention.

Moreover, in FIG. 8, portions identical to or corresponding to those in Embodiment 3 will be given identical numbering, and explanation thereof will be omitted.

In FIG. 8, power circuit modules 50E are configured in a similar manner to the power circuit modules 50D except for having molded resin layers 58D instead of the molded resin layers 58C.

The power circuit modules 50E and convex heat receiving portions 32A are electrically insulated by module electrically insulating layers 80C.

The molded resin layers 58D include: seal main body portions 59; tubular heat receiving portion surrounding lugs 64*a* that are disposed so as to project from entire outer edge regions of the seal main body portions 59 to a predetermined projecting length relative to reference surfaces; and electrically insulating lugs 60*c* that are disposed so as to project from regions of the seal main body portions 59 inside the heat receiving portion surrounding lugs 64*a* and outside the element heat radiating portions 53 to a length that is shorter than the heat receiving portion surrounding lugs 64*a* relative to the reference surfaces.

Projecting end surfaces of the electrically insulating lugs 60*b* are disposed on common curved surfaces that are approximately parallel to the reference surfaces. When the power circuit modules 50E are disposed such that the apex portions of the curved surfaces that include the projecting end surfaces of the electrically insulating lugs 60*c* (hereinafter "apex portions of the power circuit modules 50E") are aligned with the deepest portions of the heat receiving surfaces 32*a*, the electrically insulating lugs 60*c* are disposed so as to project from the reference surfaces 32*c* toward the heat receiving surfaces 32*a*, and the heat receiving portion surrounding lugs 64*a* are disposed so as to project toward the base plate 31A.

First ends of first lead terminals 54 and second lead terminals 55 are embedded in the integrated seal main body portions 59, heat receiving portion surrounding lugs 64*a*, and electrically insulating lugs 60*c*, and second end portions extend outward from the integrated seal main body portions 59, heat receiving portion surrounding lugs 64*a*, and electrically insulating lugs 60*c*.

Although not shown, molded resin layers of a field circuit module are prepared in a similar manner to that of the power circuit modules 50E.

Power circuit modules 50E that have been configured as described above are disposed such that apex portions thereof face the deepest portions of the heat receiving surfaces 32*a* of the convex heat receiving portions 32A, and the projecting end surfaces of the electrically insulating lugs 60*c* are placed in contact with the heat receiving surfaces 32*a*. The heat receiving portion surrounding lugs 64*a* surround regions in a predetermined range from leading ends of the convex heat receiving portions 32A toward base end portions, and accumulating spaces 66*a* are formed between the heat receiving portion surrounding lugs 64*a* and the convex heat receiving portions 32A.

Here, the module electrically insulating layers 80C are formed by a procedure that is similar to those for the module electrically insulating layers 80A and 80B. Specifically, the module electrically insulating layers 80C are formed by applying an electrically insulating adhesive to the heat receiving surfaces 32*a* of the convex heat receiving portions 32A, and then hardening the electrically insulating adhesive with the power circuit modules 50E pushed into the heat receiving surfaces 32*a* such that the projecting end surfaces of the electrically insulating lugs 60*c* are placed in contact with the heat receiving surfaces 32*a*. When the power circuit modules 50E are pushed into the heat receiving surfaces 32*a*, electrically insulating adhesive that overflows outside the heat receiving surfaces 32*a* of the convex heat receiving portions 32A spreads out to fill the accumulating spaces 66*a*.

The module electrically insulating layers 80C that are prepared in the above manner are constituted by: electrical insulation supporting layers 81*b* that fill the joining recess portions 63, and that are interposed between the element heat radiating portions 53 and heat receiving surfaces 32*a*; and outer electrically insulating layers 82*c* that are formed so as to fill the accumulating spaces 66*a*, and that connect outer portions of the electrically insulating lugs 60*c* that face the convex heat receiving portions 32A.

The thickness of the electrical insulation supporting layers 81*b* is similar to the projecting length of the electrically insulating lugs 60*c* from the reference surfaces of the seal main body portions 59, and the projecting length of the electrically insulating lugs 60*c* from the reference surfaces of the seal main body portions 59 is set in a similar manner to that of the electrically insulating lugs 60*a* and 60*b*.

Although not shown, a field circuit module is mounted to a corresponding convex heat receiving portion in a similar manner.

According to Embodiment 4, the heat receiving surfaces 32*a* of the convex heat receiving portions 32A have a small area in a similar manner to Embodiment 1, enabling similar effects to those in Embodiment 1 to be achieved.

Molded resin layers 58D of the power circuit modules 50E and the field circuit module each include a heat receiving portion surrounding lug 64*a* that is configured integrally with the seal main body portions 59 and that projects toward the base plate 31A from a reference surface so as to surround a predetermined range from a leading end of the convex heat receiving portion 32A toward base end portion. First ends of first lead terminals 54 and second lead terminals 55 are embedded in the integrated seal main body portions 59, heat receiving portion surrounding lugs 64*a*, and electrically insulating lugs 60*c*, and second end portions extend outward from the integrated seal main body portions 59, heat receiving portion surrounding lugs 64*a*, and electrically insulating lugs 60*c*.

By disposing the heat receiving portion surrounding lugs 64*a*, because the electrically insulating adhesive accumulates in the accumulating spaces 66*a* when the power circuit modules 50E and the field circuit module are disposed by placing the electrically insulating lugs 60*c* in contact in the heat receiving surfaces 32*a* after applying the electrically insulating adhesive to the heat receiving surfaces 32*a*, momentum of the electrically insulating adhesive that moves toward the accumulating spaces 66*a* from the heat receiving surfaces 32*a* is suppressed. Thus, electrically insulating adhesive that should fill the joining recess portions 63 no longer exudes out into the accumulating spaces 66*a*, etc., with the electrically insulating adhesive that moves toward the accumulating spaces 66*a*, enabling electrical insulation supporting layers 81*b* that have a desired shape to be reliably achieved.

Because the heat receiving portion surrounding lugs 64*a* are disposed between the first lead terminals 54 and the convex heat receiving portions 32A and between the second lead terminals 55 and the convex heat receiving portions 32A, creepage distance between the first lead terminals 54 and the convex heat receiving portions 32A and between the second lead terminals 55 and the convex heat receiving portions 32A can be lengthened.

Moreover, in Embodiment 4, the heat receiving portion surrounding lugs 64*a* are explained as being formed integrally with the seal main body portions 59 by transfer molding the power circuit modules 50E, but the heat receiving portion surrounding lugs 64*a* may also be prepared as separate parts from the seal main body portions 59, and mounted to the seal main body portions 59 in a separate step.

However, as has been described above, dimensional errors of molded resin layers 58D that have been prepared by transfer molding are in the order of several μm, and the heat receiving portion surrounding lugs 64*a* can easily be prepared to a dimensional error precision of several μm if the seal main body portions 59 and the heat receiving portion surrounding lugs 64*a* are formed integrally by molding.

Embodiment 5

Figure 9:
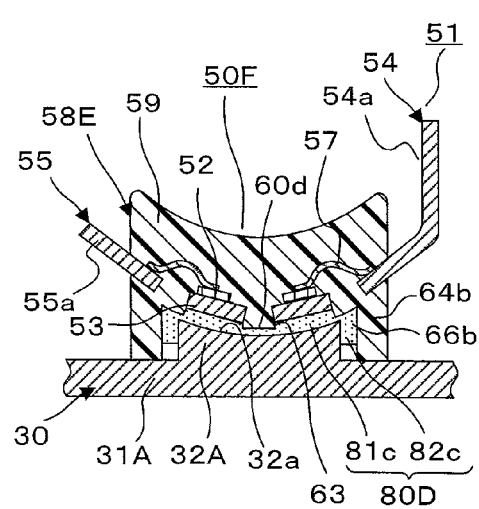
FIG. 9 is a cross section that explains a construction for mounting a power circuit module to a heatsink of a control apparatus-integrated dynamoelectric machine according to Embodiment 5 of the present invention.

FIG. 9 is a cross section that explains a construction for mounting a power circuit module to a heatsink of a control apparatus-integrated dynamoelectric machine according to Embodiment 5 of the present invention.

Moreover, in FIG. 9, portions identical to or corresponding to those in Embodiments 1 and 4 will be given identical numbering, and explanation thereof will be omitted.

In FIG. 9, power circuit modules 50F are configured in a similar manner to the power circuit modules 50E except for having molded resin layers 58E instead of the molded resin layers 58D.

The power circuit modules 50F and convex heat receiving portions 32A are electrically insulated by module electrically insulating layers 80D.

The molded resin layers 58E are configured in a similar manner to the molded resin layers 58D except for having electrically insulating lugs 60*d* and heat receiving portion surrounding lugs 64*b* that have different projecting lengths from reference surfaces than the electrically insulating lugs 60*c* and the heat receiving portion surrounding lugs 64*a* instead of the electrically insulating lugs 60*c* and the heat receiving portion surrounding lugs 64*a*.

Power circuit modules 50F that have been configured as described above are disposed such that apex portions of the electrically insulating lugs 60*d* face the deepest portions of the heat receiving surfaces 32*a* of the convex heat receiving portions 32A, and projecting ends of the heat receiving portion surrounding lugs 64*b* are placed in contact with a base plate 31A. The heat receiving portion surrounding lugs 64*b* thereby surround entire regions of the convex heat receiving portions 32A, and accumulating spaces 66*b* are formed between the heat receiving portion surrounding lugs 64*b* and the convex heat receiving portions 32A. Moreover, the projecting length of the electrically insulating lugs 60*d* from the reference surfaces is set such that appropriate gaps are formed between bottom surfaces of the element heat radiating portions 53 and the heat receiving surfaces 32*a* when the electrically insulating lugs 60*d* are placed in contact with the heat receiving surfaces 32*a*.

The module electrically insulating layers 80D are formed by the following procedure.

First, an electrically insulating adhesive is applied thickly to the heat receiving surfaces 32*a* of the convex heat receiving portions 32A allowing extra for the appropriate gaps between the reference surfaces and the heat receiving surfaces 32*a*, and the power circuit modules 50F are disposed such that the apex portions of the electrically insulating lugs 60*d* are aligned with the deepest portions of the heat receiving surfaces 32*a* of the convex heat receiving portions 32A, and the heat receiving portion surrounding lugs 64*b* surround the convex heat receiving portions 32A.

In addition, the power circuit modules 50F are pushed into the front surface of the base plate 31A until the heat receiving portion surrounding lugs 64*b* are placed in contact with the front surface of the base plate 31A. At this point, electrically insulating adhesive overflows outside the heat receiving surfaces 32*a* of the convex heat receiving portions 32A and spreads out to fill the accumulating spaces 66*b*. Thus, the module electrically insulating layers 80D are constituted by: electrical insulation supporting layers 81*c* that are interposed between the heat receiving surfaces 32*a* and the bottom surfaces of the element heat radiating portions 53 and electrically insulating lugs 60*d* that face the heat receiving surfaces 32*a*; and outer electrically insulating layers 82*c* that fill the accumulating spaces 66*b*.

Here, the thickness of the electrical insulation supporting layers 81*c* is equal to a gap between the bottom surfaces of the element heat radiating portions 53 and the heat receiving surfaces 32*a*.

The projecting length of the heat receiving portion surrounding lugs 64*b* from the reference surfaces is set such that the electrical insulation supporting layers 81*c* satisfy the electrical insulating conditions described above when the heat receiving portion surrounding lugs 64*b* are placed in contact with the base plate 31A.

The field circuit module is mounted to a corresponding convex heat receiving portion in a similar manner to the power circuit modules 50F.

A remainder of the configuration of the control apparatus-integrated dynamoelectric machine is similar to that of Embodiment 4.

According to Embodiment 5, the heat receiving surfaces 32*a* of the convex heat receiving portions 32A have a small area in a similar manner to Embodiment 1, enabling similar effects to those in Embodiment 1 to be achieved.

Molded resin layers 58E of the power circuit modules 50F and the field circuit module each include a heat receiving portion surrounding lug 64*b* that is configured integrally with the seal main body portions 59 and that projects from a reference surface so as to surround an entire region in a direction of projection of the convex heat receiving portions 32A from the base plate 31A, and come into contact with the base plate 31A. The projecting length of the heat receiving portion surrounding lugs 64*b* from the reference surfaces of the seal main body portions 59 is set such that the electrical insulation supporting layers 81*c* that are interposed between the bottom surfaces of the element heat radiating portions 53 and the heat receiving surfaces 32*a* satisfy the electrical insulating conditions when the projecting ends of the heat receiving portion surrounding lugs 64*b* are placed in contact to the base plate 31A.

Consequently, by disposing the power circuit modules 50F and the field circuit module against the heat receiving surfaces 32*a* of the convex heat receiving portions 32A such that the projecting ends of the heat receiving portion surrounding lugs 64*b* are placed in contact with the base plate 31A, electrical insulation between the heat receiving surfaces 32*a* and the element heat radiating portions 53 can be reliably prevented from being broken while suppressing significant increases in thermal resistance of the electrical insulation supporting layers 81c.

In addition, by disposing the heat receiving portion surrounding lugs 64b, creepage distance between the first lead terminals 54 and second lead terminals 55 that extend outward from the integrated seal main body portions 59, electrically insulating lugs 60d, and heat receiving portion surrounding lugs 64b and the convex heat receiving portions 32A can be lengthened.

Figure 10:
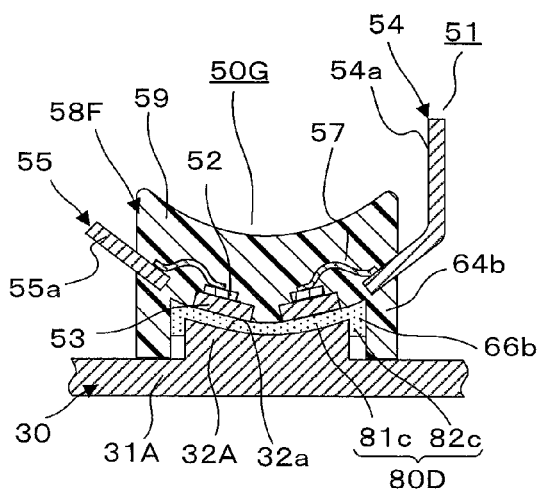
FIG. 10 is a cross section that explains a construction for mounting a power circuit module to a heatsink of a variation of a control apparatus-integrated dynamoelectric machine according to Embodiment 5 of the present invention.

Moreover, in Embodiment 5, the molded resin layers 58E are explained as being constituted by the seal main body portions 59, the electrically insulating lugs 60d, and the heat receiving portion surrounding lugs 64b, but molded resin layers are not limited to this, and may also be configured as in the molded resin layer 58F of the power circuit module 50G that is shown in FIG. 10 that will be explained below.

FIG. 10 is a cross section that explains a construction for mounting a power circuit module to a heatsink of a variation of a control apparatus-integrated dynamoelectric machine according to Embodiment 5 of the present invention.

In FIG. 10, molded resin layers 58F are configured in a similar manner to the molded resin layers 50F except that the electrically insulating lugs 60d are omitted. Similar effects to those of the power circuit modules 50F can also be achieved by power circuit modules 50G that have molded resin layers 58F that are configured in this manner.

Embodiment 6

Figure 11:
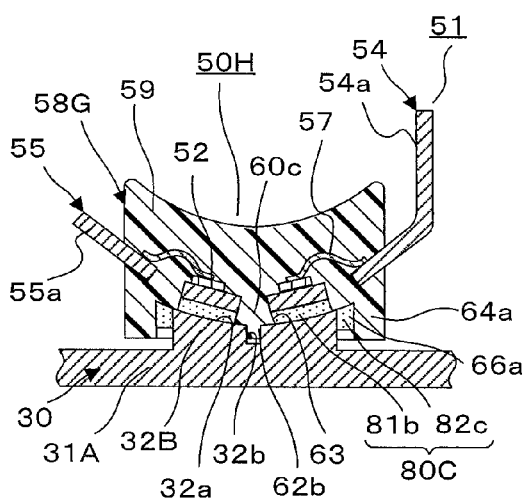
FIG. 11 is a cross section that explains a construction for mounting a power circuit module to a heatsink of a control apparatus-integrated dynamoelectric machine according to Embodiment 6 of the present invention.

FIG. 11 is a cross section that explains a construction for mounting a power circuit module to a heatsink of a control apparatus-integrated dynamoelectric machine according to Embodiment 6 of the present invention.

Moreover, in FIG. 11, portions identical to or corresponding to those in Embodiments 1, 2, and 4 will be given identical numbering, and explanation thereof will be omitted.

In FIG. 11, power circuit modules 50H are configured in a similar manner to the power circuit modules 50E except for having molded resin layers 58G instead of the molded resin layers 58D.

The molded resin layers 58G have positioning salient portions 62b that are disposed so as to project from electrically insulating lugs 60c.

Interfitting recess portions 32b are formed so as to be inside the electrically insulating lugs 60c of the power circuit modules 50G that face heat receiving surfaces 32a when the power circuit modules 50G and the heat receiving surfaces 32a are disposed so as to face each other such that apex portions of the electrically insulating lugs 60c are aligned with the deepest portions of the heat receiving surfaces 32a, in other words, when the power circuit modules 50G are disposed at predetermined positions relative to the corresponding convex heat receiving portions 32B. Here, the electrically insulating lugs 60c have external shapes that can fit together with the interfitting recess portions 32b.

Moreover, a depth of the interfitting recess portions 32b is set so as to be deeper than a projecting length of the positioning salient portions 62b from the electrically insulating lugs 60c.

Although not shown, field circuit modules have positioning salient portions that are similar to the positioning salient portions 62b.

The power circuit modules 50H are disposed such that the interfitting recess portions 32b are fitted together with the positioning salient portions 62b, and the projecting end surfaces of the electrically insulating lugs 60c are placed in contact with the heat receiving surfaces 32a. Bottom surfaces of element heat radiating portions 53 of the power circuit modules 50H are fixed to heat receiving surfaces 32a of the convex heat receiving portions 32A so as to have electrical insulation supporting layers 81b that fill the joining recess portions 63 interposed.

A field circuit module is mounted in a similar manner to a corresponding convex heat receiving portion 32A.

A remainder of the configuration of the control apparatus-integrated dynamoelectric machine is similar to that of Embodiment 4.

According to Embodiment 6, the power circuit modules 50H and the field circuit module are disposed at predetermined positions relative to the corresponding convex heat receiving portions 32B when the positioning salient portions 62b and the interfitting recess portions 32b are fitted together with each other. Consequently, in addition to the effects in Embodiment 1, effects can be achieved that enable the power circuit modules 50H and the field circuit module to be disposed easily at predetermined positions relative to the convex heat receiving portions 32B simply by disposing the power circuit modules 50H and the field circuit module such that the positioning salient portions 62a are inserted into the interfitting recess portions 32b, and the electrically insulating lugs 60a are placed in contact with the heat receiving surfaces 32a.

Embodiment 7

Figure 12:
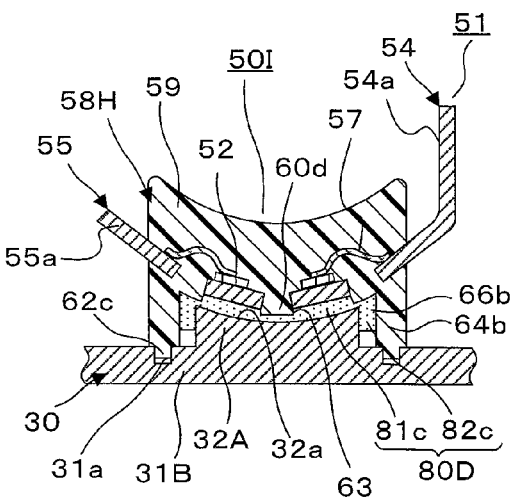
FIG. 12 is a cross section that explains a construction for mounting a power circuit module to a heatsink of a control apparatus-integrated dynamoelectric machine according to Embodiment 7 of the present invention.

FIG. 12 is a cross section that explains a construction for mounting a power circuit module to a heatsink of a control apparatus-integrated dynamoelectric machine 1 according to Embodiment 7 of the present invention.

Moreover, in FIG. 12, portions identical to or corresponding to those in Embodiments 1 and 5 will be given identical numbering, and explanation thereof will be omitted.

In FIG. 12, power circuit modules 50I are configured in a similar manner to the power circuit modules 50F except for having molded resin layers 58H instead of the molded resin layers 58E.

The molded resin layers 58H are configured in a similar manner to the molded resin layers 58E except for having a plurality of positioning salient portions 62c that are separated from each other that project outward from the projecting end surfaces of heat receiving portion surrounding lugs 64b.

A heatsink 30 has a base plate 31B in which interfitting recess portions 31a are formed that have depth directions in a thickness direction instead of the base plate 31A.

The interfitting recess portions 31a are formed on the base plate 31B so as to have openings inside regions of the base plate 31B that face the heat receiving portion surrounding lugs 64b when the power circuit modules 50I are disposed such that the apex portions of the electrically insulating lugs 60d are aligned with the deepest portions of the heat receiving surfaces 32a of the convex heat receiving portions 32A. The positioning salient portions 62c are in positional relationships so as to face the interfitting recess portions 31a and the electrically insulating lugs 60a, and the interfitting recess portions 31a are formed so as to have external shapes with which the positioning salient portions 62c can fit together.

Power circuit modules 50I that have been configured as described above are disposed such that the positioning salient portions 62c are fitted together with the interfitting recess portions 31a, and projecting ends of the heat receiving portion surrounding lugs 64b are placed in contact with a base plate 31B. The power circuit modules 50I and the heat receiving surfaces 32a are fixed by module electrically insulating layers 80D.

Although not shown, a field circuit module is mounted to a corresponding convex heat receiving portion 32A in a similar manner.

A remainder of the configuration of the control apparatus-integrated dynamoelectric machine is similar to that of Embodiment 5.

According to Embodiment 7, the heat receiving surfaces 32a of the convex heat receiving portions 32A have a small area in a similar manner to Embodiment 1, enabling similar effects to those in Embodiment 1 to be achieved.

The power circuit modules 50I and the field circuit module are disposed at predetermined positions relative to the corresponding convex heat receiving portions 32A when the positioning salient portions 62c and the interfitting recess portions 31a are fitted together with each other.

Consequently, in addition to the effects in Embodiments 1 and 5, effects can be achieved that enable the power circuit modules 50I and the field circuit module each to be disposed easily at predetermined positions relative to the corresponding convex heat receiving portions 32A simply by disposing the power circuit modules 50I and the field circuit module such that the positioning salient portions 62c are inserted into the interfitting recess portions 31a.

What is claimed is:

1. A control apparatus-integrated dynamoelectric machine comprising:
   a dynamoelectric machine main body comprising:
     a stator that has an armature winding;
     a rotor that has a field winding; and
     a housing that supports said stator and said rotor; and
   a control apparatus that is mounted integrally onto said dynamoelectric machine main body, said control apparatus comprising:
     a power circuit module and a field circuit module that respectively supply electric power to said armature winding and said field winding, said power circuit module and said field circuit module each comprising:
       a flat element heat radiating portion that is made of a metal; and
       a switching element that is mounted to a front surface of said element heat radiating portion;
     a heatsink that is prepared by die casting, said power circuit module and said field circuit module are mounted on said heatsink; and
     a switching element controlling means that controls said switching elements, wherein:
   said heatsink comprises a base plate; and a plurality of convex heat receiving portions that are each disposed so as to project from a front surface of said base plate, projecting end surfaces that constitute heat receiving surfaces, and said power circuit module and said field circuit module are respectively mounted to each of said heat receiving surfaces;
   said power circuit module and said field circuit module each comprise a seal main body portion that is made of an electrically insulating resin that seals said switching element so as to expose a bottom surface of said element heat radiating portion at a reference surface that has a surface shape that corresponds to a shape of said heat receiving surface, said power circuit module and said field circuit module each being disposed such that said bottom surface of said element heat radiating portion is oriented toward said heat receiving surface;
   an electrical insulation supporting layer is interposed between said heat receiving surface and said bottom surface of said element heat radiating portion; and
   an electrically insulating lug that is made of an electrically insulating material is configured integrally into said seal main body portion and projects toward said heat receiving surface from said reference surface, and a projecting length of said electrically insulating lug from said reference surface is set such that said electrical insulation supporting layer ensures electrical insulation between said heat receiving surface and said bottom surface of said element heat radiating portion, and has a heat radiating performance such that heat from said switching elements is radiated to said convex heat receiving portions such that the temperature of said switching elements does not exceed a predefined permissible upper limit temperature, when said power circuit module and said field circuit module are disposed so as to place said electrically insulating lug in contact with said heat receiving surface.

2. A control apparatus-integrated dynamoelectric machine according to claim 1, wherein:
   an interfitting recess portion that has an opening inside a region of said heat receiving surface that faces a projecting end of said electrically insulating lug is formed on said convex heat receiving portion; and
   a positioning salient portion that is made of an electrically insulating material, and that can be fitted together with said interfitting recess portion is disposed so as to project from said electrically insulating lug.

3. A control apparatus-integrated dynamoelectric machine according to claims 1, wherein:
   a heat receiving portion surrounding lug that is made of an electrically insulating material is configured integrally with said seal main body portion and projects toward said base plate from said reference surface so as to surround a predetermined range of said convex heat receiving portion from a leading end toward a base end portion; and
   a first end of a metal lead terminal is embedded in said seal main body portion and said heat receiving portion surrounding lug that have been integrated, and a second end portion of said metal lead terminal extends outward from said seal main body portion and said heat receiving portion surrounding lug that have been integrated.

4. A control apparatus-integrated dynamoelectric machine comprising:
   a dynamoelectric machine main body comprising:
     a stator that has an armature winding;
     a rotor that has a field winding; and
     a housing that supports said stator and said rotor; and
   a control apparatus that is mounted integrally onto said dynamoelectric machine main body, said control apparatus comprising:
     a power circuit module and a field circuit module that respectively supply electric power to said armature winding and said field winding, said power circuit module and said field circuit module each comprising:
       a flat element heat radiating portion that is made of a metal; and
       a switching element that is mounted to a front surface of said element heat radiating portion;
     a heatsink that is prepared by die casting, said power circuit module and said field circuit module are mounted on said heatsink; and
     a switching element controlling means that controls said switching elements, wherein:
   said heatsink comprises a base plate; and a plurality of convex heat receiving portions that are each disposed so as to project from a front surface of said base plate, projecting end surfaces that constitute heat receiving surfaces, and said power circuit module and said field circuit module are respectively mounted to each of said heat receiving surfaces;

said power circuit module and said field circuit module each comprise a seal main body portion that is made of an electrically insulating resin that seals said switching element so as to expose a bottom surface of said element heat radiating portion at a reference surface that has a surface shape that corresponds to a shape of said heat receiving surface, said power circuit module and said field circuit module each being disposed such that said bottom surface of said element heat radiating portion is oriented toward said heat receiving surface;

an electrical insulation supporting layer is interposed between said heat receiving surface and said bottom surface of said element heat radiating portion;

a heat receiving portion surrounding lug that is made of an electrically insulating material is configured integrally with said seal main body portion and projects outward from said reference surface so as to surround an entire region in a direction of projection of said convex heat receiving portion from said base plate and be placed in contact with said base plate; and a projecting length of said heat receiving portion surrounding lug from said reference surface is set such that said electrical insulation supporting layer ensures electrical insulation between said heat receiving surface and said bottom surface of said element heat radiating portion, and has a heat radiating performance such that heat from said switching elements is radiated to said convex heat receiving portions such that a temperature of said switching elements does not exceed a predefined permissible upper limit temperature, when said power circuit module and said field circuit module are disposed so as to place a leading end of said heat receiving portion surrounding lug in contact with said base plate.

5. A control apparatus-integrated dynamoelectric machine according to claim 4, wherein:

an interfitting recess portion that has an opening inside a region of said base plate that faces a projecting end of said heat receiving portion surrounding lug is formed on said base plate; and a positioning salient portion that is made of an electrically insulating material, and that can be fitted together with said interfitting recess portion is disposed so as to project from said heat receiving portion surrounding lug.

6. A control apparatus-integrated dynamoelectric machine according to claim 5, wherein a first end of a metal lead terminal is embedded in said seal main body portion and said heat receiving portion surrounding lug that have been integrated, and a second end portion of said metal lead terminal extends outward from said seal main body portion and said heat receiving portion surrounding lug that have been integrated.

7. A control apparatus-integrated dynamoelectric machine according to claims 1, wherein:

said power circuit module comprises an upper arm and a lower arm that each have a switching element, and that are connected such that said switching elements are in series; and said upper arm and said lower arm are sealed into an identical seal main body portion.

* * * * *